(12) United States Patent
Nozaki

(10) Patent No.: US 8,313,974 B2
(45) Date of Patent: Nov. 20, 2012

(54) SUBSTRATE TRANSPORT METHOD

(75) Inventor: Junichi Nozaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/254,606

(22) PCT Filed: Mar. 2, 2010

(86) PCT No.: PCT/JP2010/053313
§ 371 (c)(1),
(2), (4) Date: Sep. 2, 2011

(87) PCT Pub. No.: WO2010/103958
PCT Pub. Date: Sep. 16, 2010

(65) Prior Publication Data
US 2011/0318867 A1  Dec. 29, 2011

(30) Foreign Application Priority Data

Mar. 9, 2009  (JP) .................................. 2009-055066

(51) Int. Cl.
*H01L 31/18* (2006.01)
(52) U.S. Cl. .................................... 438/73; 257/E31.11
(58) Field of Classification Search .................. None
See application file for complete search history.

(56) References Cited

U.S. PATENT DOCUMENTS

| 5,509,771 A | 4/1996 | Hiroki |
| 5,558,482 A | 9/1996 | Hiroki et al. |
| 5,636,960 A | 6/1997 | Hiroki et al. |
| 5,803,932 A | 9/1998 | Akimoto et al. |
| 5,980,591 A | 11/1999 | Akimoto et al. |
| 6,313,469 B1 | 11/2001 | Tamai |

FOREIGN PATENT DOCUMENTS

| JP | 2-121346 | 5/1990 |
| JP | 6-51260 | 1/1994 |
| JP | 7-297258 | 11/1995 |
| JP | 11-130255 | 5/1999 |
| JP | 11-260889 | 9/1999 |
| JP | 2005-235916 | 9/2005 |

OTHER PUBLICATIONS

International Search Report for PCT/JP2010/053313, mailed Jun. 1, 2010.

*Primary Examiner* — Seahvosh Nikmanesh
(74) *Attorney, Agent, or Firm* — Nixon & Vanderhye, P.C.

(57) ABSTRACT

An embodiment of the substrate transport method of the present invention includes a plasma CVD apparatus (10), a first transport robot (20) that retrieves the plurality of substrates processed by the plasma CVD apparatus (10) one by one, and sequentially storing the substrates in a substrate cassette (30) capable of loading substrates in multiple stages, and a second transport robot (40) that retrieves the substrates from the substrate cassette (3) one by one and transports the substrates to a pre-patterning alignment step (50). The first transport robot (20) sequentially retrieves substrates (1a to 1e) inside a load lock chamber (12) starting with a lowermost stage, and sequentially stores the substrates (1a to 1e) in the substrate cassette (30) starting with an uppermost stage, for example, and the second transport robot (40) sequentially retrieves the substrates (1a to 1e) stored in the substrate cassette (30) starting with the uppermost stage, and transports the substrates (1a to 1e) to the alignment step (50).

3 Claims, 5 Drawing Sheets

SUBSTRATE TRANSPORT METHOD

This application is the U.S. national phase of International Application No. PCT/JP2010/053313 filed 2 Mar. 2010 which designated the U.S. and claims priority to JP Patent Application No. 2009-055066 filed 9 Mar. 2009, the entire contents of each of which are hereby incorporated by reference.

TECHNICAL FIELD

The present invention relates to a substrate transport method including a heat treatment step in which a plurality of substrates loaded in multiple stages at predetermined vertical intervals are heat-treated in a processing chamber, a storing step in which the plurality of heat-treated substrates are retrieved one by one and sequentially stored in a substrate cassette capable of loading substrates in multiple stages, and a retrieving step in which the substrates are retrieved from the substrate cassette one by one, the substrates retrieved from the substrate cassette being transported to the following processing step. Particularly, the present invention relates to a substrate transport method for transporting glass substrates, semiconductor substrates, liquid crystal substrates or the like.

BACKGROUND ART

Conventional thin-film solar cells are manufactured through (1) a front face electrode forming step, (2) a front face electrode patterning step, (3) a photoelectric conversion layer forming step, (4) a photoelectric conversion layer patterning step, (5) a rear face electrode forming step, and (6) a rear face electrode patterning step, for example. Each of the steps will be briefly described below. Note that details of each step is disclosed in JP 2005-259882A, for example, which was already filed by the present applicant, and thus only a simple description thereof is provided here.

(1) Front Face Electrode Forming Step

In the front face electrode forming step, a front face electrode is formed on an insulated light-transmitting substrate such as a glass substrate. Specific examples of the front face electrode include a transparent conductive film formed by using tin oxide, zinc oxide, ITO or the like as a material. In the front face electrode forming step, thermal CVD is favorably used, for example.

(2) Front Face Electrode Patterning Step

By patterning the front face electrode formed in the step (1), a front face electrode separation line is formed. Note that this patterning step includes an alignment step for accurately patterning the front face electrode. In the front face electrode patterning step, patterning utilizing heating by laser irradiation (laser patterning) is favorably used.

(3) Photoelectric Conversion Layer Forming Step

A photoelectric conversion layer is formed on the front face electrode, which has been subjected to patterning in the step (2). As a material for the photoelectric conversion layer, semiconductors made of Si, Ge, SiGe, SiC, SiN, GaAs, SiSn or the like can be used, for example. Also, it is preferable that the semiconductor film of the photoelectric conversion layer has a three-layer structure including p-type, i-type and n-type. In this case, in the photoelectric conversion layer forming step, plasma CVD is favorably used, for example.

(4) Photoelectric Conversion Layer Patterning Step

By patterning the photoelectric conversion layer formed in the step (3), a photoelectric conversion layer separation line is formed. Note that this patterning step includes an alignment step for accurately patterning the photoelectric conversion layer. In the photoelectric conversion layer patterning step, patterning utilizing heating by laser irradiation (laser patterning) is favorably used.

(5) Rear Face Electrode Forming Step

A rear face electrode is formed on the photoelectric conversion layer subjected to patterning in the step (4). Specific examples of the rear face electrode include a laminated film of a transparent conductive film formed by using a material such as tin oxide, zinc oxide, or ITO, and a metal film formed by using a material having good light reflectivity such as Ag, Al or Cr. In particular, a metal film formed by Ag is preferable due to its high reflectance. In this case, in the rear face electrode forming step, the sputtering method is favorably used, for example.

(6) Rear Face Electrode Patterning Step

By patterning the rear face electrode formed in the step (5), a rear face electrode separation line is formed. Note that this patterning step includes an alignment step for accurately patterning the rear face electrode. In the rear face electrode patterning step, patterning utilizing heating by laser irradiation (laser patterning) is favorably used.

Thereafter, a light-transmitting opening portion is formed by irradiating the fundamental wave of YAG laser, for example, from the glass surface onto the rear face electrode that has been subjected to patterning processing. Next, etching is performed in order to remove residues caused by laser processing, and lastly, the rear face electrode side is sealed with an adhesion layer and a transparent sealing material, thereby forming a thin-film solar cell module.

With the above-described manufacturing method, substrates are transported from the front face electrode forming step to the front face electrode patterning step, from the photoelectric conversion layer forming step to the photoelectric conversion layer patterning step, and from the rear face electrode forming step to the rear face electrode patterning step, respectively, by using a transport robot and a substrate cassette.

FIG. 4 illustrates a schematic configuration of a substrate transport system for transporting substrates from the photoelectric conversion layer forming step to the photoelectric conversion layer patterning step, as an example.

In this example, a plasma CVD apparatus 10 is used in the photoelectric conversion layer forming step. Accordingly, this substrate transport system includes the plasma CVD apparatus 10, a first transport robot 20 that retrieves a plurality of substrates (glass substrates) processed by the plasma CVD apparatus 10 one by one, and sequentially stores the substrates in a substrate cassette 30 that is capable of loading substrates in multiple stages, and a second transport robot 40 that retrieves the substrates from the substrate cassette 30 one by one, and transports the substrates to a pre-patterning alignment step 50. Note that a substrate transport system that uses a substrate cassette to transport substrates from a plasma CVD apparatus to the following step is disclosed in Patent Document 1, for example.

The plasma CVD apparatus 10 is a batch-type multiple-stage plasma CVD apparatus capable of loading substrates 1 in multiple stages at predetermined vertical intervals (although five stages are illustrated in this example, the number of stages is not limited to this) and processing the substrates at one time, and is configured by a deposition chamber 11 and a load lock chamber (retrieving chamber) 12.

In the deposition chamber 11 and the load lock chamber 12, as shown in FIG. 5(a), five pairs of supporting pieces 14a and 14b, each horizontally supporting the substrate 1 at the right and left ends thereof, are formed in five stages at predetermined vertical intervals, on side walls 13a and 13b on the right and left sides (the direction perpendicular to the paper in FIG. 4) of each of the chambers 11 and 12, so as to hold the substrates 1 (1a to 1e) respectively in five stages. Also, the substrates 1 are transported from the deposition chamber 11 to the load lock chamber 12 with arms, not shown in the drawings, respectively holding the substrates 1, and moving the substrates 1 from the deposition chamber 11 to the load lock chamber 12 at one time.

On the other hand, the substrate cassette 30 is also configured to be capable of loading the substrates 1 in multiple stages (five stages in this example) at predetermined vertical intervals, as shown in FIG. 5(b). That is, in order to hold the substrates 1 in five stages, five pairs of supporting pieces 33a and 33b, each horizontally supporting the substrate 1 at the right and left ends thereof, are formed in five stages at predetermined vertical intervals, on side walls 32a and 32b on the right and left sides (the direction perpendicular to the paper plane) of a cassette main body 31 so as to hold the substrates 1 in five stages.

The first transport robot 20 holds the substrates 1 with an robot arm one at a time, and transport the substrates 1 from the load lock chamber 12 to the substrate cassette 30. Similarly, the second transport robot 40 also holds the substrates 1 with the robot arm one at a time, and transports the substrates 1 from the substrate cassette 30 to the alignment step.

In the substrate transport system configured as described above, a conventional substrate transport method is performed as follows. Note that when each substrate 1 needs to be distinguished in the following description, a lowercase alphabetical letter is suffixed to the reference numeral 1 representing the substrate in order to distinguish the substrates 1. Also, in principle, in this description, the stages in the load lock chamber 12 and the substrate cassette 30 are counted from the bottom as the first stage, second stage, and the like. A conventional substrate transport method will be described below with reference to FIG. 4.

When five substrates 1a to 1e that have been subjected to the deposition processing are transported from the deposition chamber 11 to the load lock chamber 12, the first transport robot 20 retrieves the substrate 1a in the lowermost stage (the first stage) of the load lock chamber 12, and stores the substrate 1a in the uppermost stage (the fifth stage) of the substrate cassette 30. Next, the first transport robot 20 retrieves the substrate 1b in the second stage of the load lock chamber 12, and stores the substrate 1b in the fourth stage (the second stage from the top) of the substrate cassette 30. Next, the first transport robot 20 retrieves the substrate 1c in the third stage of the load lock chamber 12, and stores the substrate 1c in the third stage (the third stage from the top) of the substrate cassette 30. In this manner, the substrates 1a to 1e are transported from the load lock chamber 12 to the substrate cassette 30 so as to invert the vertical order of the substrates. Accordingly, lastly, the first transport robot 20 retrieves the substrate 1e in the uppermost stage (the fifth stage) of the lock chamber 12, and stores the substrate 1e in the lowermost stage (the first stage) of the substrate cassette 30.

When all the substrates 1a to 1e have been stored in the substrate cassette 30 in this manner, then, the second transport robot 40 first retrieves the substrate 1e in the lowermost stage (the first stage) from the substrate cassette 30, and transports the substrate 1e to the alignment step 50. Next, the second transport robot 40 retrieves the substrate 1d in the second stage of the substrate cassette 30, and transports the substrate 1d to the alignment step 50. Next, the second transport robot 40 retrieves the substrate 1e in the third stage of the substrate cassette 30, and transports the substrate is to the alignment step 50. In this manner, the substrates 1 are sequentially retrieved starting with the lowermost stage, and transported to the alignment step 50. Specifically, the second transport robot 40 lastly retrieves the substrate 1a in the uppermost stage (the fifth stage) of the substrate cassette 30, and transports the substrate 1a to the alignment step 50.

PRIOR ART DOCUMENTS

Patent Documents

[Patent Document 1] JP 2005-235916A

SUMMARY OF INVENTION

Problems to be Solved by the Invention

As described above, in the conventional substrate transport system, the first transport robot 20 and the second transport robot 40 both retrieve the substrates 1 starting with the lowermost stage. This is because if the substrates are retrieved starting with the uppermost stage, when a substrate 1 is retrieved, dust, dirt or the like may fall from a portion in contact with the substrate 1 onto substrates in lower stages. Accordingly, in order to prevent such falling of dust, dirt or the like onto substrates, substrates are always retrieved starting with the lowermost stage, and stored starting with the uppermost stage.

The substrates 1 that have been processed in the deposition chamber 11 and transported to the load lock chamber 12 each wait to be retrieved from the load lock chamber 12, while the substrates 1 have absorbed heat.

In this case, the temperature distribution in the load lock chamber 12 is such that hot air goes upward and air having a lower temperature goes downward due to air convection characteristics caused by heat. As a result, temperatures of the substrates 1a to 1e themselves that are waiting in the load lock chamber 12 become different, and the temperature difference is such that the temperature of the substrate 1a in the lowermost stage is low, and the temperature of the substrate 1e in the uppermost stage is the highest, the temperature of the substrates increasing towards the upper stages.

When the substrates 1 are moved from the load lock chamber 12 to the substrate cassette 30 in this state, the first transport robot 20 sequentially retrieves the substrates 1 starting with the substrate 1a at the bottom having a low temperature, and sequentially stores the substrates 1 starting with the uppermost stage of the substrate cassette 30. The second transport robot sequentially retrieves the substrates 1 starting with the substrate 1e at the bottom having a high temperature and transports the substrates 1 to the alignment step 50.

The above operation can be understood as follows, if considered in terms of the transport time of the substrates 1. Note that it is assumed that the time required for the first transport robot 20 to retrieve one substrate from the load lock chamber 12 and store the substrate in the substrate cassette 30 is tx, and the time required for the second transport robot 40 to retrieve one substrate from the substrate cassette 30 and transport the substrate to the alignment step 50 is ty, and there is no waiting time for the transport between the robots.

The substrate 1a in the lowermost stage of the load lock chamber 12 is retrieved first from the load lock chamber 12, and stored in the substrate cassette 30 in a transport time 1tx. After that, in the substrate cassette 30, a waiting time 4tx passes until the remaining four substrates 1b to 1e are all stored in the substrate cassette 30. Accordingly, the transport time of the substrate 1a from the load lock chamber 12 to the substrate cassette 30 including the waiting time, that is, the time from the point in time when the substrate 1a has been retrieved from the load lock chamber 12 until the remaining four substrates 1b to 1e are all stored in the substrate cassette 30, amounts to 5tx (=1tx+4tx). On the other hand, with respect to the transport time of the substrate 1a from the substrate cassette 30 to the alignment step 50, since the substrate 1a is retrieved fifth from the substrate cassette 30, a waiting time 4ty for the four preceding substrates 1b to 1e to be retrieved and transported to the alignment step 50 occurs. Accordingly, the transport time from the point in time when all the substrates 1a to 1e have been stored in the substrate cassette 30 until the substrate 1a is retrieved from the substrate cassette 30 and transported to the alignment step 50, including the waiting time, amounts to 5ty (=4ty+1ty). As a result, the total transport time for the substrate 1a to be retrieved from the load lock chamber 12 and transported to the alignment step 50 amounts to (5tx+5ty).

The substrate 1b in the second stage (the fourth stage from the top) of the load lock chamber 12 is retrieved second from the load lock chamber 12, and stored in the substrate cassette 30 in the transport time 1tx. After that, in the substrate cassette 30, a waiting time 3tx passes until the remaining three substrates 1c to 1e are all stored in the substrate cassette 30. Accordingly, the transport time of the substrate 1b from the load lock chamber 12 to the substrate cassette 30 including the waiting time, that is, the time from the point in time when the substrate 1b has been retrieved from the load lock chamber 12 until the remaining six substrates 1c to 1e are stored in the substrate cassette 30, amounts to 4tx (=1tx+3tx). On the other hand, with respect to the transport time of the substrate 1b from the substrate cassette 30 to the alignment step 50, since the substrate 1b is retrieved fourth from the substrate cassette 30, a waiting time 3ty for the three preceding substrates 1c to 1e to be retrieved and transported to the alignment step 50 occurs. Accordingly, the transport time from the point in time when all the substrates 1a to 1e have been stored in the substrate cassette 30 until the substrate 1b is retrieved from the substrate cassette 30 and transported to the alignment step 50, including the waiting time, amounts to 4ty (=3ty+1ty). As a result, the total transport time for the substrate 1b to be retrieved from the load lock chamber 12 and transported to the alignment step 50 amounts to (4tx+4ty).

The substrate 1c in the third stage (the third stage from the top) of the load lock chamber 12 is retrieved third from the load lock chamber 12, and stored in the substrate cassette 30 in the transport time 1tx. After that, in the substrate cassette 30, a waiting time 2tx passes until the remaining two substrates 1d and 1e are all stored in the substrate cassette 30. Accordingly, the transport time of the substrate 1c from the load lock chamber 12 to the substrate cassette 30 including the waiting time, that is, the time from the point in time when the substrate 1c has been retrieved from the load lock chamber 12 until the remaining two substrates 1d and 1e are stored in the substrate cassette 30, amounts to 3tx (=1tx+2tx). On the other hand, with respect to the transport time of the substrate 1c from the substrate cassette 30 to the alignment step 50, since the substrate 1c is retrieved third from the substrate cassette 30, a waiting time 2ty for the two preceding substrates 1d and 1e to be retrieved and transported to the alignment step 50 occurs. Accordingly, the transport time from the point in time when all the substrates 1a to 1e have been stored in the substrate cassette 30 until the substrate 1c is retrieved from the substrate cassette 30 and transported to the alignment step 50, including the waiting time, amounts to 3ty (=2ty+1ty). As a result, the total transport time for the substrate 1c to be retrieved from the load lock chamber 12 and transported to the alignment step 50 amounts to (3tx+3ty).

The substrate 1d in the fourth stage (the second stage from the top) of the load lock chamber 12 is retrieved fourth from the load lock chamber 12, and stored in the substrate cassette 30 in the transport time 1tx. After that, in the substrate cassette 30, a waiting time 1tx passes until the remaining one substrate 1e is stored in the substrate cassette 30. Accordingly, the transport time of the substrate 1d from the load lock chamber 12 to the substrate cassette 30 including the waiting time, that is, the time from the point in time when the substrate 1d has been retrieved from the load lock chamber 12 until the remaining one substrate 1e is stored in the substrate cassette 30, amounts to 2tx (=1tx+1tx). On the other hand, with respect to the transport time from the substrate cassette 30 to the alignment step 50, since the substrate 1d is retrieved second from the substrate cassette 30, a waiting time 1ty for the preceding one substrate 1e to be retrieved and transported to the alignment step 50 occurs. Accordingly, the transport time from the point in time when all the substrates 1a to 1e have been stored in the substrate cassette 30 until the substrate 1d is retrieved from the substrate cassette 30 and transported to the alignment step 50, including the waiting time, amounts to 2ty (=1ty+1ty). As a result, the total transport time for the substrate 1d to be retrieved from the load lock chamber 12 and transported to the alignment step 50 amounts to (2tx+2ty).

The substrate 1e in the uppermost stage of the load lock chamber 12 is retrieved fifth from the load lock chamber 12, and stored in the substrate cassette 30 in the transport time 1tx. In this case, there is no waiting time in the substrate cassette 30 for the substrate 1e, and thus the transport time of the substrate 1e from the load lock chamber 12 to the substrate cassette 30 is 1tx. On the other hand, with respect to the transport time from the substrate cassette 30 to the alignment step 50, since the substrate 1e is retrieved first from the substrate cassette 30, and it is retrieved from the substrate cassette 30 immediately after being stored therein to be transported to the alignment step 50. That is, no waiting time occurs to the substrate 1e in the substrate cassette 30. Accordingly, the transport time from the point in time when all the substrates 1a to 1e have been stored in the substrate cassette 30 until the substrate 1e is retrieved from the substrate cassette 30 and transported to the alignment step 50 amounts to 1ty. As a result, the total transport time for the substrate 1e to be retrieved from the load lock chamber 12 and transported to the alignment step 50 amounts to (1tx+1ty).

As understood from the above description, the total transport time (5tx+5ty) of the substrate 1a retrieved from the lowermost stage of the load lock chamber 12 to the alignment step 50 and the total transport time (1tx+1ty) of the substrate 1e retrieved from the uppermost stage of the load lock chamber 12 to the alignment step 50 constitutes a fivefold transport time difference.

As a result, the substrate 1e is transported to the alignment step 50 at a high temperature before being fully cooled, and the substrate 1a is transported to the alignment step 50 at a low temperature after being fully cooled. This temperature difference is more conspicuous as the number of stages increases.

In the alignment step 50, adjustments for following patterning are performed. If there is a temperature difference between the substrates (glass substrates) 1a to 1e as described above, since the substrates themselves expands or contracts, alignment errors occur. As a result, at the time of laser patterning, a substrate that has not been fully cooled and has a high temperature is subjected to patterning in an expanded state, and a substrate that has been fully cooled and has a low temperature is subjected to patterning in a normal state, which causes an issue in that patterning errors occur, in other words, a large variance in products occurs.

The present invention has been made in order to solve the above-described issues, and aims at providing a substrate transport method in which by eliminating (or reducing) a time difference in the substrate transport from the heat treatment step to the following processing step, a temperature difference between the substrates in the following alignment step and patterning step is eliminated, thereby preventing the occurrence of alignment errors and patterning errors due to expansion of the substrates.

Means for Solving the Problems

In order to solve the above-described issues, a substrate transport method of the present invention includes: a heat treatment step of performing heat treatment on a plurality of substrates loaded in multiple stages at predetermined vertical intervals in a processing chamber; a storing step of retrieving the plurality of heat-treated substrates one by one, and sequentially storing the substrates in a substrate cassette capable of loading substrates in multiple stages; and a retrieving step of retrieving the substrates from the substrate cassette one by one, the substrates retrieved from the substrate cassette being transported to a following processing step, wherein supporting pieces that support the substrates in a horizontal orientation are formed in the substrate cassette in a plurality of stages at predetermined vertical intervals, and partition plates are provided between the stages, and the substrates are transported from the substrate cassette to a following processing step by retrieving the substrates from the substrate cassette in an order in which the substrates have been retrieved from the processing chamber and stored in the substrate cassette, and transporting the substrates to the following processing step.

For example, a configuration may be adopted in which in the storing step, the substrates retrieved starting with the lowermost stage of the processing chamber (more specifically, the load lock chamber) are stored in the substrate cassette starting with the uppermost stage, and in the retrieving step, the substrates are sequentially retrieved starting with the uppermost stage of the substrate cassette and transported to the following processing step.

Also, in the present invention, the substrates are glass substrates, the heat treatment step is a CVD processing step, and the following processing step is an alignment step. Also, the CVD processing step is a step of forming thin-film solar cell devices on the glass substrates, and the alignment step is an adjustment step for laser-patterning the thin-film solar cell devices formed on the glass substrates.

As described with reference to the above-described conventional techniques, the substrate transport method of the present invention also may use a substrate transport system as shown in FIG. 4, including the plasma CVD apparatus 10, the first transport robot 20 that retrieves a plurality of substrates (glass substrates) processed by the plasma CVD apparatus 10 one by one, and sequentially stores the substrates in the substrate cassette 30 capable of loading substrates in multiple stages, and the second transport robot 40 that retrieves the substrates from the substrate cassette 30 one by one, and transports the substrates to the pre-patterning alignment step 50.

In the present invention, although the same method for transporting substrates from the load lock chamber 12 of the plasma CVD apparatus 10 to the substrate cassette 30 may be employed, the transport method employed when transporting substrates from the substrate cassette 30 to the alignment step 50 is different from that in the conventional techniques.

That is, the substrates are sequentially retrieved starting with the uppermost stage of the substrate cassette 30 and transported to the following alignment step. Specifically, when the substrate cassette 30 is focused on, the first-in first-out system is employed for the substrates stored in the substrate cassette 30. As s result, the total transport time for the substrate 1a stored in the lowermost stage of the load lock chamber 12 to be retrieved from the load lock chamber 12 and transported to the alignment step 50 is (5tx+1ty), and the total transport time for the substrate 1e stored in the uppermost stage of the load lock chamber 12 to be retrieved from the load lock chamber 12 and transported to the alignment step 50 is (1tx+5ty). Here, assuming that the transport time tx is approximately the same as the transport time ty (e.g., tz), the total transportation time of the substrate 1a stored in the lowermost stage of the load lock chamber 12 and that of the substrate 1e stored in the uppermost stage of the load lock chamber 12 are approximately the same (6tz). With respect to other substrates 1b to 1e, their total transport times are between the total transport time of the substrate 1a and the total transport time of the substrate 1e, and thus with the substrate transport method of the present invention, the total transport times for all the substrates 1a to 1e can be made approximately the same.

In this case, in the present invention, the substrates are retrieved from the substrate cassette 30 starting with the uppermost stage. For this reason, as described in the above section "Problems to be Solved by the Invention", there is an issue in that dust or dirt caused when a substrate is retrieved from an upper stage may fall onto substrates in lower stages. Therefore, in the present invention, as shown in FIG. 2, a configuration is adopted in which supporting pieces 33a and 33b horizontally supporting the substrates are formed on right and left side walls 32a and 32b inside a cassette main body 31 of the substrate cassette 30. Pairs of the supporting pieces 33a and 33b are formed in multiple stages at predetermined vertical intervals, and partition plates 34 are disposed between the stages each including a pair of supporting pieces 33a and 33b. In this manner, even when the substrates 1 are retrieved starting with the uppermost stage, dust or dirt caused when a substrate is retrieved falls onto the partition plate 34, and never falls onto substrates stored below.

Effects of the Invention

The present invention is configured as described above, and therefore it is possible to transport all substrates retrieved from the processing chamber in the heat treatment step to the following processing step in an approximately the same transport time. Therefore, it is possible that the substrates that have been transported to the following processing step are cooled to an approximately the same temperature. That is, an expansion difference between the substrates due to heat can be eliminated. As a result, if the following processing step is an alignment step, for example, it is possible to eliminate alignment errors due to expansion of the substrates, which also enables to avoid the occurrence of variance in products in the following patterning step.

MODES FOR CARRYING OUT THE INVENTION

Hereinafter, embodiments of the present invention will be described with reference to the drawings.

Figure 1:
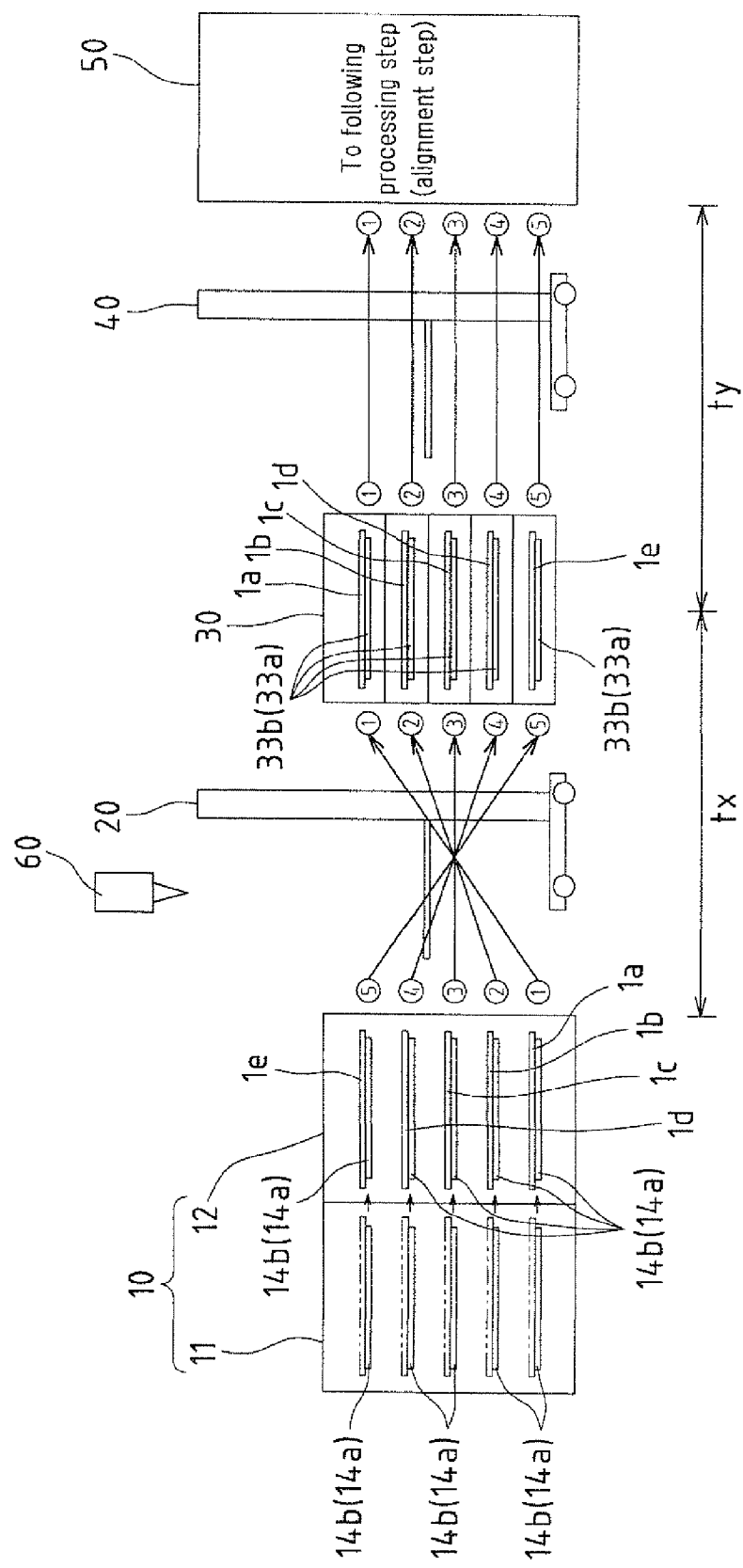
FIG. 1 is a schematic configuration diagram of a substrate transport system to which a substrate transport method of the present invention is applied.

FIG. 1 is a schematic configuration diagram of a substrate transport system to which a substrate transport method of the present invention is applied.

The configuration of the substrate transport system is the same as that of the conventional substrate transport system described above and shown in FIG. 4, and includes a plasma CVD apparatus 10, a first transport robot 20 that retrieves a plurality of substrates (glass substrates) processed by the plasma CVD apparatus 10 one by one, and sequentially stores the substrates in a substrate cassette 30 capable of loading substrates in multiple stages, and a second transport robot 40 that retrieves the substrates from the substrate cassette 30 one by one, and transports the substrates to a pre-patterning alignment step 50. Note that in the present embodiment, a film thickness measurement apparatus 60 is disposed in a transport path between the plasma CVD apparatus 10 and the substrate cassette 30 for measuring the thickness of the film formed on the transported substrate. That is, as a result of the film thickness measurement apparatus 60 measuring the thickness of the film formed on the substrate, if the measured value is less than or equal to a preset reference value, that substrate is eliminated from the manufacturing line as a defective product. In this manner, it is possible to prevent the occurrence of defective products due to defective film thickness.

Figure 2:
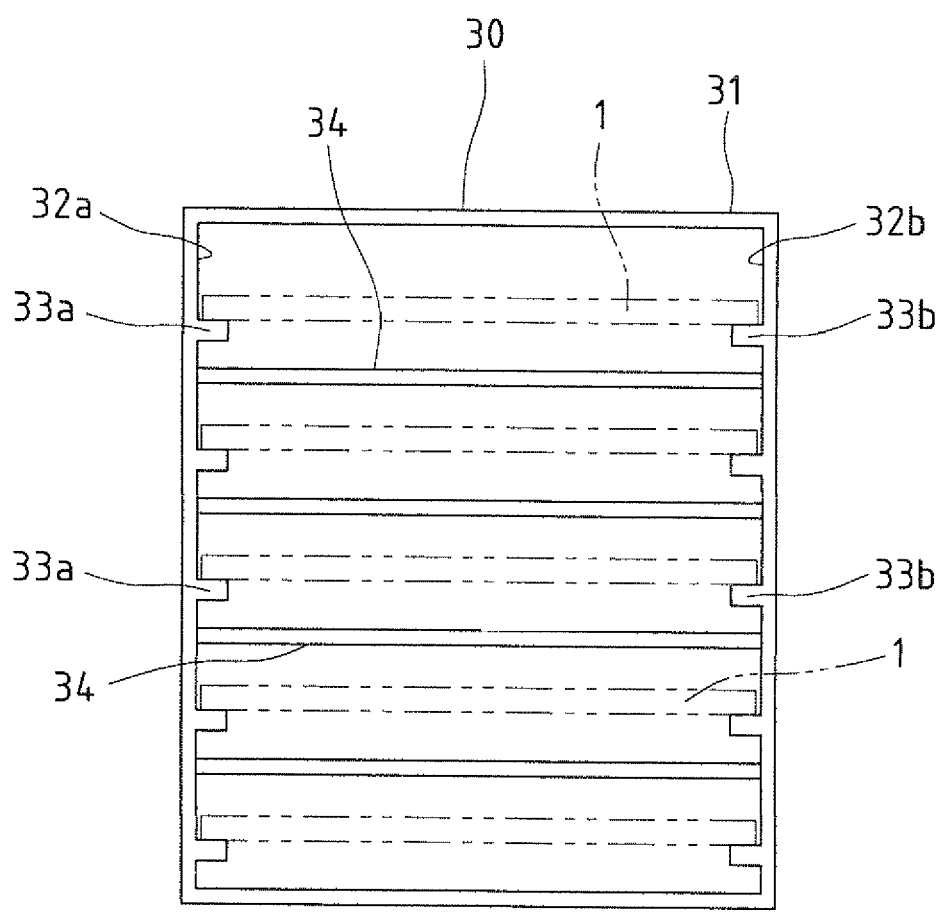
FIG. 2 is a schematic configuration diagram of a substrate cassette of the present invention.

FIG. 2 illustrates the configuration of the substrate cassette 30 of the present invention.

The substrate cassette 30 of the present invention has pairs of supporting pieces 33a and 33b horizontally supporting right and left ends of the substrates formed on right and left side walls 32a and 32b inside a cassette main body 31. The pairs of the supporting pieces 33a and 33b are formed in multiple stages at predetermined vertical intervals, and partition plates 34 are disposed between the stages, each stage including a pair of supporting pieces 33a and 33b. In this manner, even when the substrates 1 are retrieved starting with the uppermost stage, dust or dirt that has occurred while the substrate 1 is retrieved falls onto the partition plates 34, and never falls onto the substrates stored below.

The substrate transport method of the present invention is performed as follows by using the substrate transport system configured as described above. The substrate transport method of the present invention will be described below with reference to FIG. 1.

When five substrates 1a to 1e that have been subjected to deposition processing have been transported from the deposition chamber 11 to the load lock chamber 12, the first transport robot 20 retrieves the substrate 1a in the lowermost stage (the first stage) of the load lock chamber 12, and stores the substrate 1a in the uppermost stage (the fifth stage) of the substrate cassette 30. Next, the first transport robot 20 retrieves the substrate 1b in the second stage of the load lock chamber 12, and stores the substrate 1b in the fourth stage (the second stage from the top) of the substrate cassette 30. Next, the first transport robot 20 retrieves the substrate 1c in the third stage of the load lock chamber 12, and stores the substrate 1c in the third stage (the third stage from the top) of the substrate cassette 30. In this manner, the substrates 1a to 1e are transported from the load lock chamber 12 to the substrate cassette 30 so as to invert the vertical order of the substrates. Accordingly, lastly, the first transport robot 20 retrieves the substrate 1e in the uppermost stage (the fifth stage) of the lock chamber 12, and stores the substrate 1e in the lowermost stage (the first stage) of the substrate cassette 30.

When all the substrates 1a to 1e are stored in the substrate cassette 30 in this manner, then, the second transport robot 40 first retrieves the substrate 1a in the uppermost stage (the fifth stage) from the substrate cassette 30, and transports the substrate 1a to the alignment step 50. Next, the second transport robot 40 retrieves the substrate 1b in the fourth stage (the second stage from the top) of the substrate cassette 30, and transports the substrate 1d to the alignment step 50. Next, the second transport robot 40 retrieves the substrate 1c in the third stage (the third stage from the top) of the substrate cassette 30, and transports the substrate 1c to the alignment step 50. In this manner, the substrates 1 are sequentially retrieved starting with the uppermost stage, and transported to the alignment step 50. Specifically, the second transport robot 40 retrieves lastly the substrate 1e in the lowermost stage (the first stage) of the substrate cassette 30, and transports the substrate 1e to the alignment step 50.

The above substrate transport method is understood as follows, if considered in terms of the transport time of the substrates 1a to 1e. Note that it is assumed that the time required for the first transport robot 20 to retrieve one substrate from the load lock chamber 12 and store the substrate in the substrate cassette 30 is tx, and the time required for the second transport robot 40 to retrieve one substrate from the substrate cassette 30 and transport the substrate to the alignment step 50 is ty, there is no waiting time for the transport between the robots.

The substrate 1a in the lowermost stage of the load lock chamber 12 is retrieved first from the load lock chamber 12, and stored in the substrate cassette 30 in a transport time 1tx. After that, in the substrate cassette 30, a waiting time 4tx passes until the remaining four substrates 1b to 1e are all stored in the substrate cassette 30. Accordingly, the transport time of the substrate 1a from the load lock chamber 12 to the substrate cassette 30 including the waiting time, that is, the time from the point in time when the substrate 1a has been retrieved from the load lock chamber 12 until all the substrates 1a to 1e are stored in the substrate cassette 30, amounts to 5tx (=1tx+4tx). On the other hand, with respect to the transport time from the substrate cassette 30 to the alignment step 50, since the substrate 1a is retrieved first from the substrate cassette 30, it is retrieved from the substrate cassette 30 immediately after being stored therein to be transported to the alignment step 50. That is, no waiting time occurs to the substrate 1a in the substrate cassette 30. Accordingly, the transport time from the point in time when all the substrates 1a to 1e have been stored in the substrate cassette 30 until the substrate 1a is retrieved from the substrate cassette 30 and transported to the alignment step 50 is 1ty. As a result, the total transport time for the substrate 1a to be retrieved from the load lock chamber 12 and transported to the alignment step 50 amounts to (5tx+1ty).

The substrate 1b in the second stage from the bottom of the load lock chamber 12 is retrieved second from the load lock chamber 12, and stored in the substrate cassette 30 in the transport time 1tx. After that, in the substrate cassette 30, a waiting time 3tx passes until the remaining three substrates $1c$ to $1e$ are all stored in the substrate cassette 30. Accordingly, the transport time of the substrate $1b$ from the load lock chamber 12 to the substrate cassette 30 including the waiting time, that is, the time from the point in time when the substrate $1b$ has been retrieved from the load lock chamber 12 until all the substrates $1a$ to $1e$ are stored in the substrate cassette 30, amounts to 4tx (=1tx+3tx). On the other hand, with respect to the transport time from the substrate cassette 30 to the alignment step 50, since the substrate $1b$ is retrieved second from the substrate cassette 30, a waiting time 1ty for the preceding one substrate $1a$ to be retrieved and transported to the alignment step 50 occurs. Accordingly, the transport time from the point in time when all the substrates $1a$ to $1e$ have been stored in the substrate cassette 30 until the substrate $1b$ is retrieved from the substrate cassette 30 and transported to the alignment step 50, including the waiting time, amounts to 2ty (=1ty+1ty). As a result, the total transport time for the substrate $1b$ to be retrieved from the load lock chamber 12 and transported to the alignment step 50 amounts to (4tx+2ty).

The substrate $1c$ in the third stage from the bottom of the load lock chamber 12 is retrieved third from the load lock chamber 12, and stored in the substrate cassette 30 in the transport time 1tx. After that, in the substrate cassette 30, a waiting time 2tx passes until the remaining two substrates $1d$ and $1e$ are all stored in the substrate cassette 30. Accordingly, the transport time of the substrate $1c$ from the load lock chamber 12 to the substrate cassette 30 including the waiting time, that is, the time from the point in time when the substrate $1c$ has been retrieved from the load lock chamber 12 until all the substrates $1a$ to $1e$ are stored in the substrate cassette 30, amounts to 3tx (=1tx+2tx). On the other hand, with respect to the transport time from the substrate cassette 30 to the alignment step 50, since the substrate $1c$ is retrieved third from the substrate cassette 30, a waiting time 2ty for the two preceding substrates $1a$ and $1b$ to be retrieved and transported to the alignment step 50 occurs. Accordingly, the transport time from the point in time when all the substrates $1a$ to $1e$ have been stored in the substrate cassette 30 until the substrate $1c$ is retrieved from the substrate cassette 30 and transported to the alignment step 50, including the waiting time, amounts to 3ty (=2ty+1ty). As a result, the total transport time for the substrate $1c$ to be retrieved from the load lock chamber 12 and transported to the alignment step 50 amounts to (3tx+3ty).

The substrate $1d$ in the fourth stage from the bottom of the load lock chamber 12 is retrieved fourth from the load lock chamber 12, and stored in the substrate cassette 30 in the transport time 1tx. After that, in the substrate cassette 30, a waiting time 1tx passes until the remaining one substrate $1e$ is stored in the substrate cassette 30. Accordingly, the transport time of the substrate $1d$ from the load lock chamber 12 to the substrate cassette 30 including the waiting time, that is, the time from the point in time when the substrate $1d$ has been retrieved from the load lock chamber 12 until all the substrates $1a$ to $1e$ are stored in the substrate cassette 30, amounts to 2tx (=1tx+1tx). On the other hand, with respect to the transport time from the substrate cassette 30 to the alignment step 50, since the substrate $1e$ is retrieved fourth from the substrate cassette 30, a waiting time 3ty for the preceding three substrates $1a$ to $1c$ to be retrieved and transported to the alignment step 50 occurs. Accordingly, the transport time from the point in time when all the substrates $1a$ to $1e$ have been stored in the substrate cassette 30 until the substrate $1d$ is retrieved from the substrate cassette 30 and transported to the alignment step 50, including the waiting time, amounts to 4ty (=3ty+1ty). As a result, the total transport time for the substrate $1d$ to be retrieved from the load lock chamber 12 and transported to the alignment step 50 amounts to (2tx+4ty).

The substrate $1e$ in the uppermost stage of the load lock chamber 12 is retrieved fifth from the load lock chamber 12, and stored in the substrate cassette 30 in the transport time 1tx. In this case, no waiting time occurs to the substrate $1e$, and thus the transport time from the point in time when the substrate $1d$ has been retrieved from the load lock chamber 12 until all the substrates $1a$ to $1e$ are stored in the substrate cassette 30 is 1tx. On the other hand, with respect to the transport time from the substrate cassette 30 to the alignment step 50, since the substrate $1e$ is retrieved fifth from the substrate cassette 30, a waiting time 4ty for the preceding four substrates $1a$ to $1d$ to be retrieved and transported to the alignment step 50 occurs. Accordingly, the transport time from the point in time when all the substrates $1a$ to $1e$ have been stored in the substrate cassette 30 until the substrate $1e$ is retrieved from the substrate cassette 30 and transported to the alignment step 50 amounts to 5ty (=4ty+1ty). As a result, the total transport time for the substrate $1e$ to be retrieved from the load lock chamber 12 and transported to the alignment step 50 amounts to (1tx+5ty).

As understood from the above description, the total transport time (5tx+1ty) of the substrate $1a$ retrieved from the lowermost stage of the load lock chamber 12 to the alignment step 50 and the total transport time (1tx+5ty) of the substrate $1e$ retrieved from the uppermost stage of the load lock chamber 12 to the alignment step 50 has a transport time difference that is four times the difference between time tx and time ty (|txty|). Here, if the time tx and time ty is approximately the same (e.g., tz), the total transport time of the substrate $1a$ retrieved from the lowermost stage of the load lock chamber 12 to the alignment step 50 and the total transport time of the substrate $1e$ retrieved from the uppermost stage of the load lock chamber 12 to the alignment step 50 are both 6tz. Also, with respect to the other substrates $1b$ to $1e$, their total transport times are between the total transport time of the substrate $1a$ and the total transport time of the substrate $1e$, and thus with the substrate transport method of the present invention, the total transport times for all the substrates $1a$ to $1e$ can be made approximately the same, namely, 6tz.

As a result, all the substrates $1a$ to $1e$ are cooled to an approximately the same temperature when they have been transported to the alignment step 50, and thus in the alignment step 50, alignment can be performed on the substrates $1a$ to $1e$ in a state where there is no difference in the expansion conditions thereof. As a result, also in the following patterning step, it is possible to pattern the thin-film solar cell elements under equal conditions, and thus variance in products can be suppressed.

Figure 3:
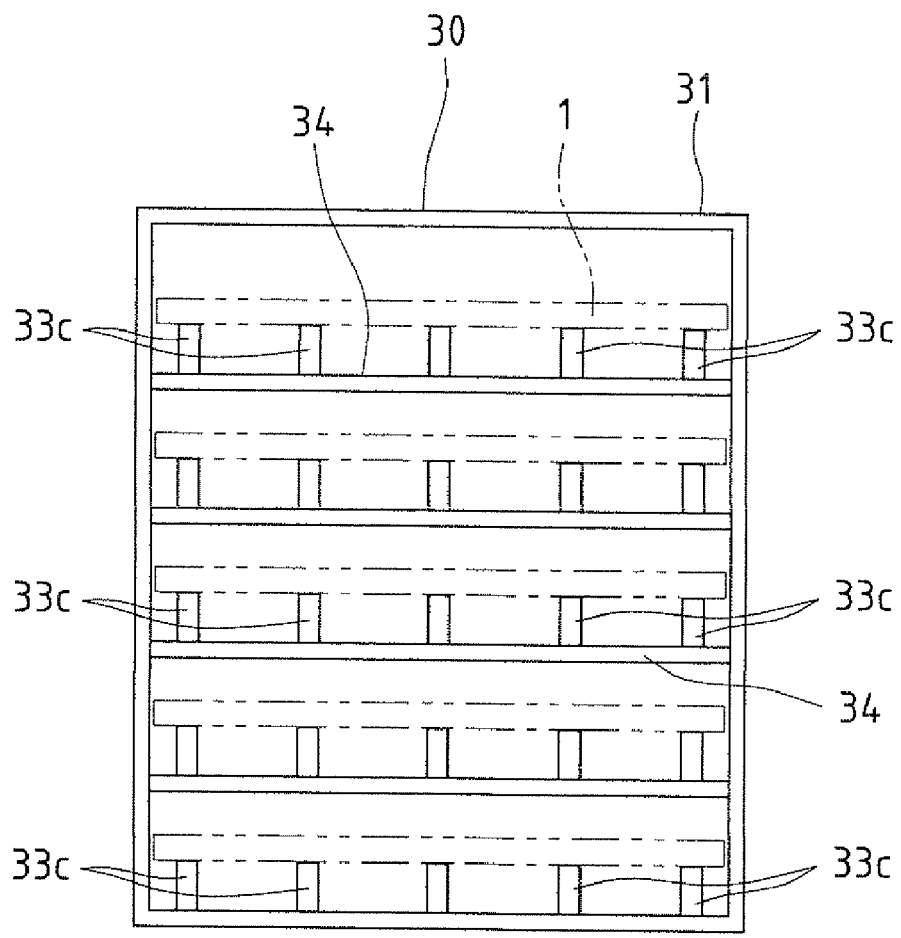
FIG. 3 is a schematic configuration diagram of another example of a substrate supporting structure of the substrate cassette.

Note that in the forgoing embodiments, pairs of the supporting pieces $33a$ and $33b$, each horizontally supporting the right and left end portions of the substrate, are formed on the right and left side walls $32a$ and $32b$ inside the cassette main body 31 as supporting structures for horizontally supporting the substrates inside the substrate cassette 30, but the structure for supporting the substrate is not limited to these. For example, as shown in FIG. 3, projection portions $33c$ that function as supporting pieces may be provided. In this example, on the top faces of the partition plates 34, several projection portions $33c$ are formed at predetermined intervals in the width direction and the depth direction (the depth direction is not shown in the drawing), and substrates are horizontally supported by these projection portions $33c$. When the substrate is retrieved, the robot arm of the second transport robot 40 is inserted into spaces between the projection portions 33c disposed in the width direction, and lifted a little, so that the substrate can be retrieved from the substrate cassette 30.

Figure 4:
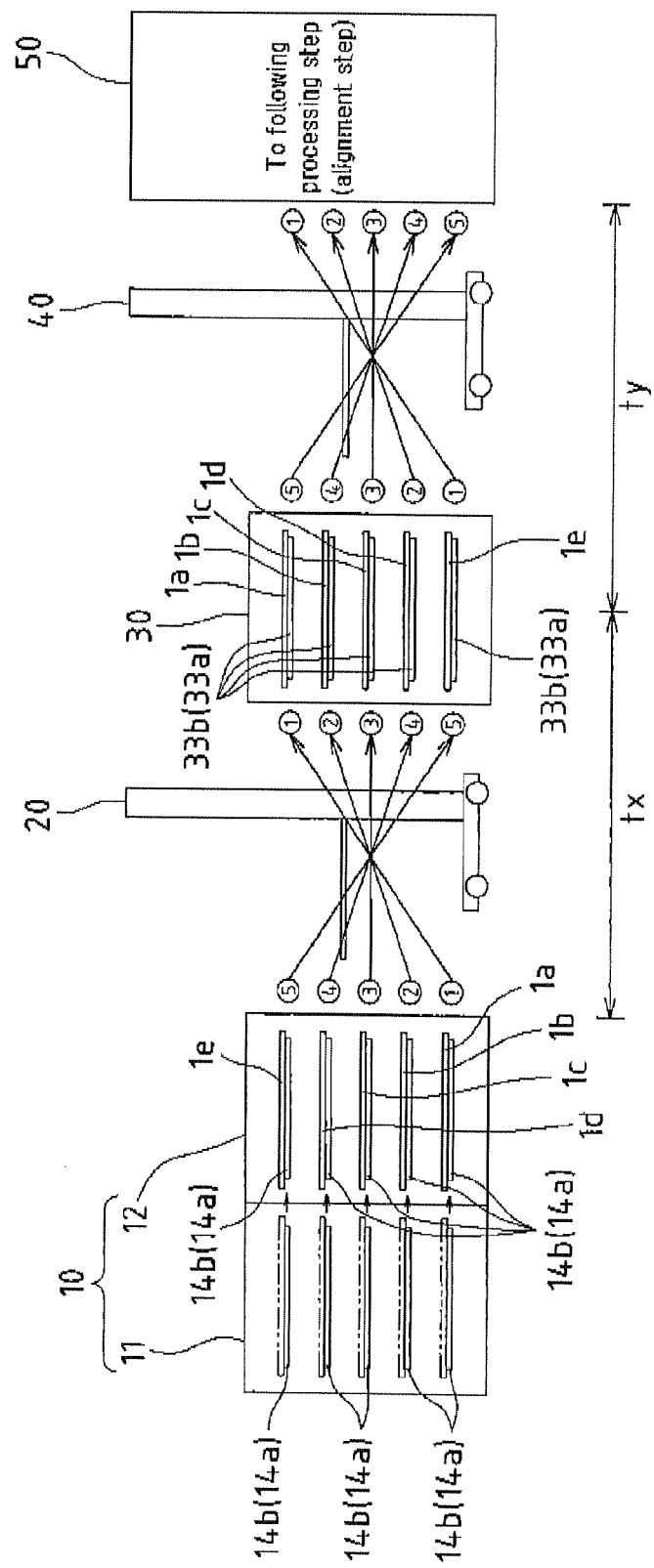
FIG. 4 is a schematic configuration diagram of a substrate transport system to which a conventional substrate transport method is applied.
Figure 5:
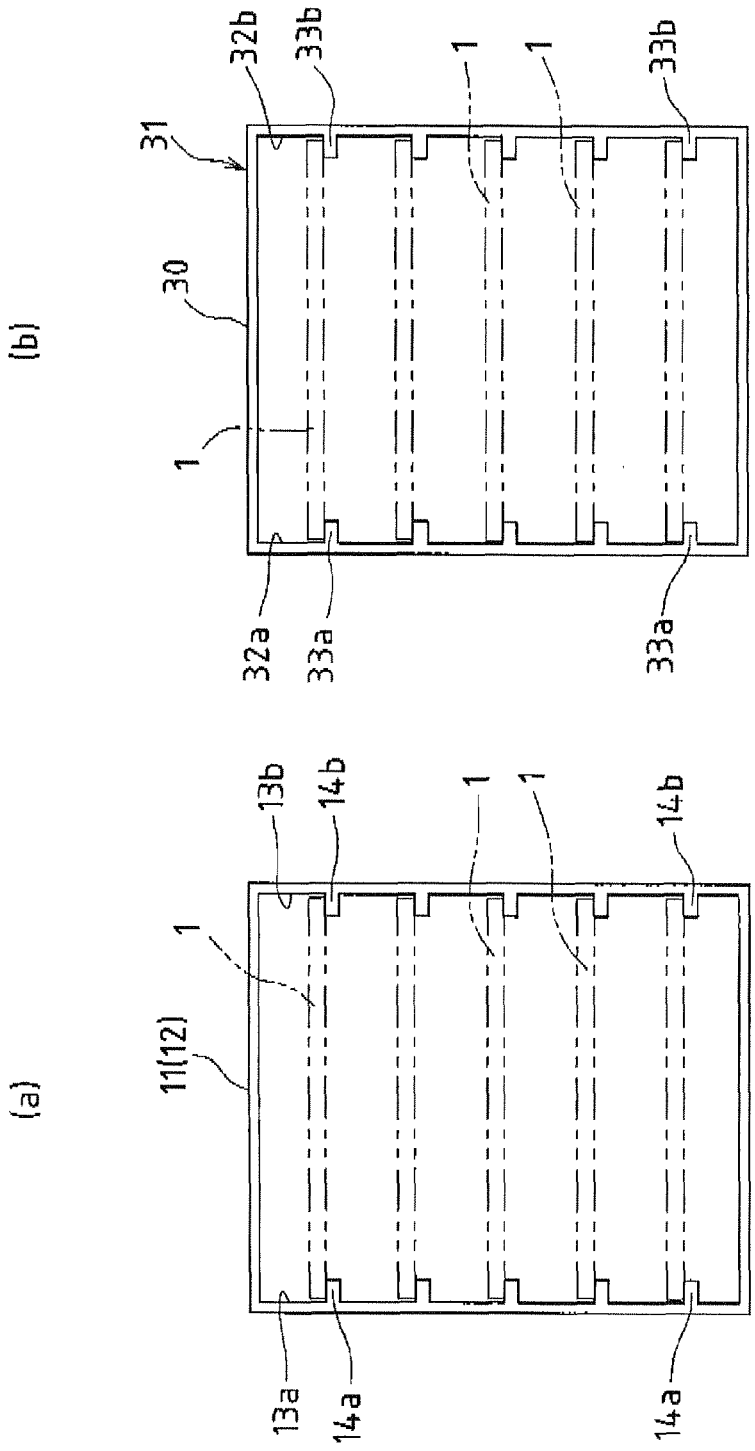
FIG. 5(a) is a schematic configuration diagram of a load lock chamber.
FIG. 5(b) is a schematic configuration diagram of a conventional substrate cassette.

Also in the foregoing embodiments, for the purpose of easy comparison with the conventional transport method shown in FIG. 4, the substrates 1 retrieved from the load lock chamber 12 are stored in the substrate cassette 30 starting with the uppermost stage, and when the substrates 1 are retrieved from the substrate cassette 30, they are retrieved starting with the uppermost stage. However, since the partition plates 34 are provided in the substrate cassette 30, the substrates 1 retrieved from the load lock chamber 12 may be stored in the substrate cassette 30 starting with the lowermost stage, and when the substrates 1 are retrieved from the substrate cassette 30, they may be retrieved starting with the lowermost stage, for example. Also, the stage from which to start storage is not limited to the uppermost stage or the lowermost stage, and the substrate 1 retrieved from the load lock chamber 12 may be stored in an arbitrary empty stage in the substrate cassette 30. In this case, the order in which the substrates 1 are stored is remembered, and the substrates 1 may be retrieved in that order.

Furthermore, in the foregoing embodiments, although a case is described in which there is a restriction to retrieving of the substrates from the load lock chamber 12 (that is, the restriction that the substrates are retrieved starting with the lowermost stage in order to prevent the occurrence of defects due to dust or dirt falling onto the substrates stored below), by providing partition plates also in the load lock chamber 12, as in the substrate cassette 30 shown in FIG. 2 or FIG. 3, the restriction to retrieving of the substrates from the load lock chamber 12 can be eliminated as well. Therefore, a substrate transport method becomes possible in which a substrate is retrieved from the uppermost stage side of the load lock chamber 12 and stored in the uppermost stage side of the substrate cassette 30, and the substrate is retrieved starting with the uppermost stage side of the substrate cassette 30, for example. Furthermore, it becomes possible to retrieve a substrate from an arbitrary stage of the load lock chamber 12 and store the substrate in an arbitrary stage of the substrate cassette 30.

Note that in the foregoing embodiments, the substrate transport method of the present invention is described by using a case in which the substrate transport method of the present invention is applied to the transport method of glass substrates for solar cells, but the present invention is not limited to the transport method of glass substrates for solar cells. For example, the substrate transport method of the present invention can be applied to the transport method of semiconductor substrates or liquid crystal substrates in a manufacturing line for semiconductor devices or liquid crystal panels.

The present invention may be embodied in various other forms without departing from the gist or essential characteristics thereof. Therefore, the embodiments disclosed in this application are to be considered in all respects as illustrative and not limiting. The scope of the invention is indicated by the appended claims rather than by the foregoing description. All modifications or changes that come within the meaning and range of equivalency of the claims are intended to be embraced therein.

This application claims priority on Japanese Patent Application No. 2009-055066 filed in Japan on Mar. 9, 2009, the entire content of which is incorporated herein by reference.

Furthermore, the entire contents of references cited in the present specification are herein specifically incorporated by reference.

INDUSTRIAL APPLICABILITY

The substrate transport method of the present invention is preferably used for a substrate transport method in a manufacturing line for solar cells, a substrate transport method in a manufacturing line for semiconductor devices, and a substrate transport method in a manufacturing line for liquid crystal panels, for example.

DESCRIPTION OF REFERENCE NUMERALS ($1a$ to $1e$) substrate
10 plasma CVD apparatus
11 deposition chamber
$11a$, $11b$
12 load lock chamber
$13a$ left side wall
$13b$ right side wall
$14a$, $14b$ supporting piece
20 first transport robot
30 substrate cassette
31 cassette main body
$32a$ left-side wall
$32b$ right side wall
$33a$, $33b$ supporting piece
34 partition plate
40 second transport robot
50 alignment step
60 film thickness measurement apparatus

The invention claimed is:

1. A substrate transport method comprising: a heat treatment step of performing heat treatment on a plurality of substrates loaded in multiple stages at predetermined vertical intervals in a processing chamber; a storing step of retrieving the plurality of heat-treated substrates one by one, and sequentially storing the substrates in a substrate cassette capable of loading substrates in multiple stages; and a retrieving step of retrieving the substrates from the substrate cassette one by one, the substrates retrieved from the substrate cassette being transported to a following processing step,
   wherein supporting pieces that support the substrates in a horizontal orientation are formed in the substrate cassette in a plurality of stages at predetermined vertical intervals, and partition plates are provided between the stages, and
   the substrates are transported from the substrate cassette to a following processing step by retrieving the substrates from the substrate cassette in an order in which the substrates have been retrieved from the processing chamber and stored in the substrate cassette, and transporting the substrates to the following processing step.

2. The substrate transport method according to claim 1, wherein the substrates are glass substrates, the heat treatment step is a CVD processing step, and the following processing step is an alignment step.

3. The substrate transport method according to claim 2, wherein the CVD processing step is a step of forming thin-film solar cell devices on the glass substrates, and the alignment step is an adjustment step for laser-patterning the thin-film solar cell devices formed on the glass substrates.

* * * * *